United States Patent
Beranek

(10) Patent No.: US 7,853,144 B2
(45) Date of Patent: Dec. 14, 2010

(54) OPTICAL BENCH FIBER OPTIC TRANSMITTER

(75) Inventor: Mark W. Beranek, Leonardtown, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 666 days.

(21) Appl. No.: 11/900,143

(22) Filed: Sep. 5, 2007

(65) Prior Publication Data

US 2009/0060529 A1   Mar. 5, 2009

(51) Int. Cl.
*H04B 10/08* (2006.01)

(52) U.S. Cl. .............................. 398/21; 398/33; 398/30; 398/31; 398/20; 398/13; 385/129; 385/31; 356/73.1

(58) Field of Classification Search ................. 398/21, 398/17, 169, 170, 168, 79, 164, 135, 136, 398/137, 138, 139, 33, 182, 183, 195, 196, 398/197, 198, 200, 201, 202, 10, 13, 20, 398/25, 26, 27, 28, 30, 31; 385/47, 88, 89, 385/90, 92, 93, 129, 31, 32, 44, 45, 50; 356/73.1
See application file for complete search history.

(56) References Cited

U.S. PATENT DOCUMENTS

| 5,907,417 | A   * | 5/1999  | Darcie et al. ................... 398/20 |
| 6,406,196 | B1  * | 6/2002  | Uno et al. ....................... 385/89 |
| 7,386,213 | B2  * | 6/2008  | Shimizu et al. ............. 385/129 |
| 2004/0179784 | A1 * | 9/2004 | Vancoille et al. .............. 385/47 |
| 2005/0286895 | A1 * | 12/2005 | Lee et al. ...................... 398/79 |

* cited by examiner

*Primary Examiner*—Hanh Phan
(74) *Attorney, Agent, or Firm*—Mark O. Glut

(57) ABSTRACT

The subassembly includes a laser for emitting signals towards fibers to be monitored, a passive alignment carrier, a photodetector for monitoring reflected laser signals from the fibers and for monitoring laser output power, and an optical fiber. The laser is disposed within the passive alignment carrier. The optical fiber is embedded in the passive alignment carrier, and has an angled fiber facet. The laser emits signals toward and through the angled fiber facet, whereby a portion of the laser signal illuminates the photodetector, and another portion illuminates the fibers that are being monitored and reflects back to the photodetector such that faults on the fibers can be detected.

Figure 1:
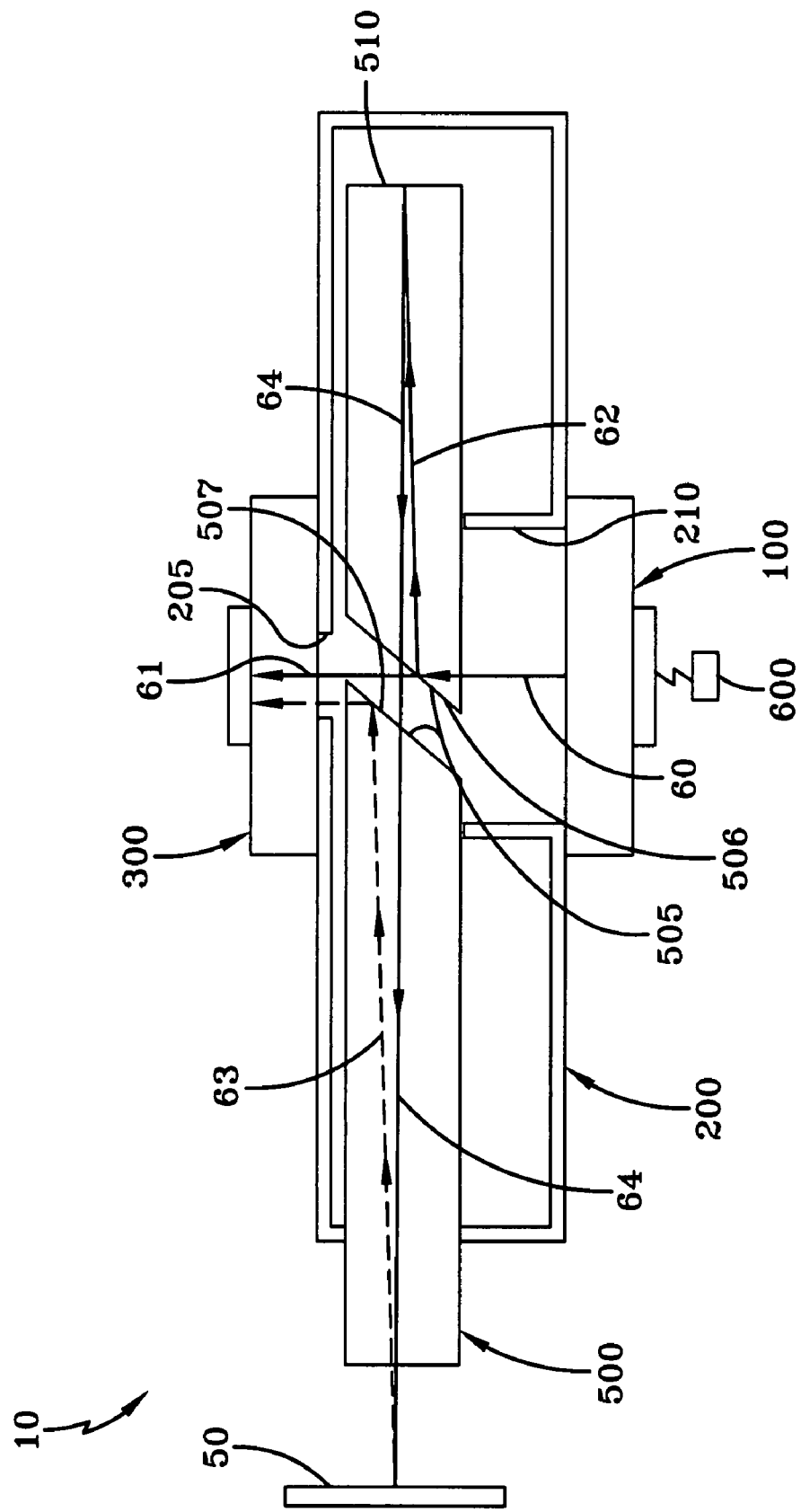

17 Claims, 1 Drawing Sheet

OPTICAL BENCH FIBER OPTIC TRANSMITTER

STATEMENT OF GOVERNMENT INTEREST

The invention described herein may be manufactured and used by or for the Government of the United States of America for governmental purposes without payment of any royalties thereon or therefor.

CROSS REFERENCES TO RELATED APPLICATIONS

The above listed invention is hereby cross referenced and related to U.S. patent application Ser. 11/789,120, filed Apr. 25, 2007, entitled "Transceiver Optical Subassembly" by inventor Mark W. Beranek and U.S. patent application Ser. No. 11/789,121, filed Apr. 25, 2007, entitled "Hybrid Fiber Optic Transceiver Optical Subassembly" by inventor Mark W. Beranek. U.S. patent application Ser. Nos. 11/789,120 and 11/789,121 are not admitted to be prior art with respect to the present invention. The applications are hereby incorporated by reference. All the inventions are assigned to the same assignee and have been invented by the same inventor.

BACKGROUND

The present invention relates to an optical bench fiber optic transmitter or a receiver optical subassembly for use in fiber optic communication systems. More specifically, but without limitation, the present invention relates to a transmitter, and a receiver optical subassembly with vertical cavity surface emitting laser power monitoring and optical time domain reflectrometry functionality.

Laser diode power monitoring is often used to control and monitor output power and modulation parameters of a laser diode inside a transmitter package. Laser power monitoring can also be used in conjunction with receiver signal strength indication to report the health characteristics in fiber optic links. In particular, laser power monitoring may be used to determine, isolate and find faults in avionics fiber optic links.

Previous methods to find faults in fiber optic cables utilize a silicon optical bench based digital laser transmitter optical subassembly that enables both digital optical communication and optical time domain reflectrometry. These optical subassembly configurations, however, do not allow vertical cavity surface emitting laser power monitoring or edge emitting laser diode power monitoring in optical subassemblies configured for isolating faults down to the fiber optic transmitter, receiver, and cable plant level.

For the foregoing reasons, there is a need for monitoring the optical power of both vertical cavity surface emitting and edge emitting laser diodes in optical subassemblies configured for isolating faults down to the fiber optic transmitter, receiver, and cable plant level.

SUMMARY

The present invention is directed to a transmitter or subassembly that meets the needs enumerated above and below.

The present invention is directed to an optical bench fiber optic transmitter that includes a laser for emitting laser signals, a passive alignment carrier, a photodetector for monitoring reflected laser signals from fiber(s) being monitored and for monitoring laser output power, and an optical fiber. The passive alignment carrier is disposed between the laser and the photodetector, and the optical fiber is embedded in the passive alignment carrier and disposed perpendicularly to the laser signal emitted by the laser. The optical fiber has an angled fiber facet and a mirrored end face surface. The laser emits signals toward and through the angled fiber facet, whereby a portion of the laser signal illuminates the photodetector, and another portion traverses down the optical fiber toward the mirrored end face surface and reflects off the mirrored end face surface toward the fibers that are being monitored, and reflects back from the fibers being monitored to the photodetector such that faults on the fibers can be detected.

It is a feature of the present invention to provide an optical bench fiber optic transmitter that allows vertical cavity surface emitting laser power monitoring and/or edge emitting laser diode power monitoring.

It is a feature of the present invention to provide an optical bench fiber optic transmitter that can accurately locate and isolate faults in fiber optic cables and/or fiber optic transceivers.

DRAWINGS

These and other features, aspects and advantages of the present invention will become better understood with reference to the following description and appended claims, and accompanying drawing wherein:

FIG. 1 is a side view of an embodiment of the optical bench fiber optic transmitter.

DESCRIPTION

The preferred embodiments of the present invention are illustrated by way of example below and in FIG. 1. As seen in FIG. 1, the optical bench fiber optic transmitter 10 for laser power monitoring includes a laser 100 for emitting laser signals 60, a passive alignment carrier 200, a photodetector 300 for monitoring reflected laser signals 63 from fiber(s) 50 being monitored and for monitoring laser output power, and an optical fiber 500. The passive alignment carrier 200 is disposed between the laser 100 and photodetector 300. The optical fiber 500 is embedded in the passive alignment carrier 200, and has an angled fiber facet 505 and a mirrored end face surface 510. The laser 100 emits signals 60 toward and through the angled fiber facet 505, whereby a portion of the laser signal (the photodetector laser portion 61) illuminates the photodetector 300, and another portion (the end face surface light portion 62) traverses down the optical fiber 500 toward the mirrored end face surface 510 and reflects off the mirrored end face surface 510 (the reflected portion from the mirrored end face surface 510 may be referred to as the fiber light portion 64) toward the fiber(s) 50 that are being monitored, and reflects back from the fiber(s) 50 being monitored (the light portion reflected from the fiber(s) 50 may be referred to as the reflected laser signal 63) to the photodetector 300 such that faults on the fiber(s) 50 can be detected.

In the description of the present invention, the invention will be discussed in an avionic or aircraft fiber link environment; however, this invention can be utilized for any type of need that requires use of an optical bench fiber optic transmitter or transceiver optical subassembly. The subassembly or transmitter 10 may be used, but without limitations, in military operations, communications, and various other electronic uses. Additionally, the same techniques and/or subassembly described here for laser diodes can be applied to surface emitting and edge emitting LEDs, as well as other types of lasers.

A laser 100 may be defined, but without limitation, as a light source producing, through stimulated emission, coherent, near monochromatic light, or light amplification by stimulated emission of radiation. One embodiment of the invention includes a laser 100 that is a vertical cavity surface emitting laser (VCSEL). A vertical cavity surface emitting laser (VCSEL) is typically, but without limitation, a specialized laser diode (a laser diode, also known as an injection laser or diode laser, may be defined, but without limitation, as a semiconductor device that produces coherent radiation (in which the waves are all at the same frequency and phase) in the visible or infrared (IR) spectrum when current passes through it). The transceiver optical subassembly 10 may also include a laser driver circuit 600. The laser driver circuit 600 provides current to the laser 100 such that the laser 100 emits signals 60, specifically optical signals 60 or light.

A passive alignment carrier 200 may be, but without limitation, defined as, a substrate with topographically etched features and metallizations that enable the automatic alignment of optical and optoelectronic components including optical fibers, laser diodes, LEDs, and photodetectors. The passive alignment carrier 200 may be a silicon optical bench or a silicon v groove passive alignment carrier. In the preferred embodiment the passive alignment carrier 200 includes a silicon substrate. In the embodiment of the invention shown in FIG. 1, the silicon substrate may also include a first aperture 205 to allow easier luminal or optical communication with the photodetector 300 and a second aperture 210 to allow easier luminal or optical communication with the laser 100.

A photodetector 300 may be defined, but without limitation, as a device capable of sensing light and converting it to electricity. The photodetector 300 may be a positive-intrinsic-negative (p-i-n) photodetector, either front illuminated or back illuminated, a metal-semiconductor-metal (MSM), or an avalanche photodiode or photodetector. However, any type of photodetector can be utilized, as practicable.

An optical fiber 500 may be defined, but without limitation, as a waveguide medium used to transmit information via light impulses rather than through the movement of electrons. The preferred optical fiber 500 is a multimode optical fiber transmitting in the about 800 to about 1600 nm range. The angled fiber facet 505 is a polished plane that is angled or oblique to the axis of the optical fiber 500, and acts as a beam splitter. The optical fiber 500 may include a transmitting reflective angled fiber facet 506 (which splits the signal 60 into the photodetector laser portion 61 and the end face surface light portion 62) and a reflective signal angled fiber facet 507 (which reflects the reflected laser signals 63 toward the photodetector 300). The mirrored end face surface 510 may be defined, but without limitation, as a polished plane that is angled perpendicular to the axis of the optical fiber 500. The mirror typically is a reflective thin film material. However, any material that allows a light or optical signal to reflect may be utilized.

In operation, in the transmitter 10 shown in FIG. 1, the laser signal 60 emitted from the laser 100 passes through the angled fiber facet 505, specifically the transmitting reflective angled fiber facet 506. The transmitting reflective angled fiber facet 506 splits the laser signal 60. A portion of the laser signal 60, the photodetector laser portion 61, passes through the first aperture 205 and illuminates the photodetector 300. Another portion of the laser signal 60, the end face surface light portion 62, travels to the mirrored end face surface 510, typically along the axis of the optical fiber 500, and then is reflected along the axis of the optical fiber 500 back in the opposite direction towards and to the fiber(s) 50 (the fiber light portion 64). The light is then reflected from the fibers 50 in the opposite direction toward and to the photodetector 300 (the reflected laser signal 63) and illuminates the photodetector 300. The photodetector 300 is in electronic communication with a processor that based on the illumination of the photodetector can determine if and where the fiber(s) 50 are experiencing a fiber optic link fault.

When introducing elements of the present invention or the preferred embodiment(s) thereof, the articles "a," "an," "the," and "said" are intended to mean there are one or more of the elements. The terms "comprising," "including," and "having" are intended to be inclusive and mean that there may be additional elements other than the listed elements.

Although the present invention has been described in considerable detail with reference to a certain preferred embodiments thereof, other embodiments are possible. Therefore, the spirit and scope of the appended claims should not be limited to the description of the preferred embodiment(s) contained herein.

What is claimed is:

1. A optical bench fiber optic transmitter, the transmitter comprising:
   a laser for emitting laser signals;
   a passive alignment carrier;
   a photodetector for monitoring reflected laser signals from fibers being monitored and for monitoring laser output power, the passive alignment carrier disposed between the laser and the photodetector;
   an optical fiber, the optical fiber embedded in the passive alignment carrier and disposed perpendicularly to the laser signal emitted by the laser, the optical fiber having an angled fiber facet and a mirrored end face surface, the laser emitting signals toward and through the angled fiber facet, whereby a portion of the laser signal illuminates the photodetector, and another portion traversing down the optical fiber toward the mirrored end face surface and reflecting off the mirrored end face surface toward the fibers that are being monitored, and reflecting back from the fibers being monitored to the photodetector such that faults on the fibers can be detected.

2. The transmitter of claim 1, wherein the laser is a vertical cavity surface emitting laser.

3. The transmitter of claim 1, wherein the passive alignment carrier is an optical bench.

4. The transmitter of claim 1, wherein the passive alignment carrier is a silicon v groove passive alignment carrier.

5. The transmitter of claim 4, wherein the laser is a vertical cavity surface emitting laser, and the passive alignment carrier includes a silicon substrate.

6. The transmitter of claim 5, wherein the subassembly further includes a laser driver circuit for providing current to the laser such that the laser can emit signals.

7. The transmitter of claim 6, wherein the photodetector is a positive-intrinsic-negative (p-i-n) photodetector.

8. The transmitter of claim 7, wherein the photodetector is front illuminated.

9. The transmitter of claim 8, wherein the photodetector is back illuminated.

10. The transmitter of claim 1, wherein the optical fiber is a multimode optical fiber.

11. The transmitter of claim 10, wherein the optical fiber transmits in the about 800 to about 1600 nm range.

12. A silicon optical bench fiber optic transmitter, the transmitter comprising:
   a laser for emitting laser signals;
   a passive alignment carrier;
   a photodetector for monitoring reflected laser signals from fibers being monitored and for monitoring laser output power, the passive alignment carrier disposed between the laser and the photodetector;

an optical fiber, the optical fiber embedded in the passive alignment carrier and disposed perpendicularly to the laser signal emitted by the laser, the optical fiber having a reflective signal angled fiber facet and transmitting reflective angled fiber facet and a mirrored end face surface, the laser emitting signals toward and through the transmitting reflective angled fiber facet, whereby a portion of the laser signal illuminates the photodetector, and another portion traversing down the optical fiber toward the mirrored end face surface and reflecting off the mirrored end face surface toward the fibers that are being monitored, and reflecting back from the fibers by the reflective signal angled fiber facet toward the photodetector such that faults on the fibers can be detected.

13. The transmitter of claim 12, wherein the laser is a vertical cavity surface emitting laser.

14. The transmitter of claim 13, wherein the passive alignment carrier is an optical bench.

15. The transmitter of claim 14, wherein the passive alignment carrier is a silicon v groove passive alignment carrier.

16. The transmitter of claim 15, wherein the laser is a vertical cavity surface emitting laser, and the passive alignment carrier includes a silicon, substrate.

17. The transmitter of claim 16, wherein the subassembly further includes a laser driver circuit for providing current to the laser such that the laser can emit signals.

* * * * *